United States Patent [19]

Hammeke

[11] Patent Number: 4,724,299
[45] Date of Patent: Feb. 9, 1988

[54] LASER SPRAY NOZZLE AND METHOD

[75] Inventor: Albert W. Hammeke, Pennsauken, N.J.

[73] Assignee: Quantum Laser Corporation, Edison, N.J.

[21] Appl. No.: 38,879

[22] Filed: Apr. 15, 1987

[51] Int. Cl.⁴ .............................................. B23K 26/00
[52] U.S. Cl. ......................... 219/121 L; 219/121 LE; 219/121 FS
[58] Field of Search ...... 219/121 L, 121 LM, 121 LC, 219/121 LD, 121 LE, 121 LF, 121 FS; 428/53.1

[56] References Cited

U.S. PATENT DOCUMENTS

| | | | |
|---|---|---|---|
| 3,303,319 | 2/1967 | Steigerwald | 219/121 |
| 3,947,653 | 3/1976 | Fairbairn | 219/76 |
| 3,947,654 | 3/1976 | Fairbairn | 219/121 LM |
| 4,015,100 | 3/1977 | Gnanamuthu et al. | 219/121 LM |
| 4,031,854 | 6/1977 | Sprague, Jr. | 118/641 |
| 4,117,302 | 9/1978 | Earle et al. | 219/121 LM |
| 4,125,926 | 11/1978 | Gale et al. | 29/156.5 R |
| 4,157,923 | 6/1979 | Yen et al. | 148/4 |
| 4,200,669 | 4/1980 | Schaefer et al. | 427/53.1 |
| 4,243,867 | 1/1981 | Earle et al. | 219/121 LC |
| 4,269,868 | 5/1981 | Livsey | 427/53.1 |
| 4,299,860 | 11/1981 | Schaefer et al. | 427/53.1 |
| 4,300,474 | 11/1981 | Livsey | 118/641 |
| 4,323,756 | 4/1982 | Brown et al. | 219/121 LF |
| 4,474,861 | 10/1984 | Ecer | 428/614 |

FOREIGN PATENT DOCUMENTS 0091893  6/1982  Japan ........................ 219/121 LE

*Primary Examiner*—C. L. Albritton
*Attorney, Agent, or Firm*—Shlesinger, Arkwright & Garvey

[57] ABSTRACT

A laser spray nozzle assembly includes a nozzle body with first and second spaced apart end portions. A beam passageway extends between the end portions and permits a laser beam to pass therethrough. A housing surrounds the second end portion. The housing is spaced from the second end portion and forms an annular passage. The housing has an opening coaxial with the beam passageway for permitting the laser beam to pass therethrough. A cladding powder supply system is operably associated with the passage for supplying cladding powder thereto so that the powder exits the opening coaxial with the beam.

21 Claims, 4 Drawing Figures

LASER SPRAY NOZZLE AND METHOD

BACKGROUND OF THE INVENTION

A metal article may have the surface thereof alloyed, or otherwise treated, by the simultaneous and cooperative operation of a laser beam with an alloy powder. Typically, the beam melts a relatively small volume of the outer surface of the article and the powder system delivers a controlled volume of allowing particles into this molten volume. The alloying particles become dispersed throughout this volume and therewith alter the composition of the outer layer in a selected way. Removal of the beam, such as by advancement of the workpiece relative to the focal point of the beam, causes the molten volume to be rapidly chilled. The chilling occurs so rapidly that the volume retains the characteristics of the molten mix.

Many metal articles which can be advantageously clad by the above process have intricate geometries, thereby requiring the surface thereof to be moved in an irregular pattern relative to the beam focal point and the powder aim point. Naturally, the chilled volume should have a uniform composition. It is important that the molten volume per unit time be substantially constant, and that the powder application to this volume also remain substantially constant per unit time. Should the volume or the powder delivery rate vary relative to each other, then the resulting chilled volume will have a discontinuous composition.

Conventional laser cladding techniques move the metal article relative to the focal point through the use of jigs, parts handlers and the like. The beam focal point therefore remains fixed in space, as does the powder aim point. Uniform movement of the metal article usually requires a complicated jig which is difficult to manufacture, usually expensive and frequently not very successful, particularly with extremely intricate geometries. For this reason, laser cladding of metal parts having intricate geometries has been difficult to achieve on a consistently uniform basis.

Robots have become a standard piece of operating equipment in many metalworking plants. The typical robot has a wrist with 5 degrees of freedom. The robot is typically powered electrically, hydraulically or pneumatically, or some combination of these means. The robot wrist can utilize these 5 degrees of freedom, all the while moving at a relatively uniform velocity.

Utilization of a robot in conjunction with a laser cladding system represents one means for achieving a uniform clad. The present invention discloses a laser spray nozzle which is particularly adapted for use with a robot in order to permit uniform cladding of metal parts of complicated geometry. The article may remain fixed in space and the nozzle may therefore move relative to the article in cooperation with movement of the robot arm. Alternatively, the nozzle may remain fixed and the article moved by the robot.

The laser spray nozzle of the invention achieves uniform clad composition because the beam exits the nozzle substantially coaxially with the cladding powder, both having the same focal point. The nozzle has a common outlet for the beam and the powder so that both are consistently directed at the same point on the article. In this way, a common focal point is achieved which assures uniform clad composition.

OBJECTS AND SUMMARY OF THE INVENTION

The primary object of the disclosed invention is to provide a laser spray nozzle assembly and method which assures consistent and uniform cladding of metal articles of complicated geometry.

The laser spray nozzle assembly of the invention comprises a nozzle body having first and second spaced apart end portions and a beam passageway extending therebetween. The laser beam enters the passageway through the first end portion and exits through the second end portion. A housing surrounds the second end portion and is spaced therefrom to form an annular passage. The housing has an opening coaxial with the beam passageway so that the laser beam may pass therethrough. A powder delivery system supplies powder to the annular passage so that the powder exits the outlet coaxial with the beam and with a common focal point.

A large amount of heat is required to metallurgically fuse the alloying powder to the substrate, typically requiring temperatures of 3,000° C. or better. As a consequence thereof, the housing is conveniently cooled through the use of a water jacket. Also, the nozzle body itself may be cooled with a water jacket.

The nozzle body is movable relative to the housing in order to permit the gap therewith to be adjusted. Adjustment of the gap between the housing and the nozzle body permits the direction of the powder to be controlled, so that the focal point thereof can be adjusted.

Preferably, the assembly has a telescope to regulate the size of the exiting beam. Once the beam size has been adjusted, then the focal point of the beam is adjusted, as is the focal point of the exiting powder.

The housing also includes a ring assembly to uniformly distribute the powder about the passage prior to exit through the outlet. This distribution plate assures that the exiting powder is uniformly distributed in the molten layer because it is uniformly distributed in the nozzle.

These and other objects and advantages of the invention will be readily apparent in view of the following description and drawings of the above described invention.

DESCRIPTION OF THE DRAWINGS

The above and other objects and advantages and novel features of the present invention will become apparent from the following detailed description of the preferred embodiment of the invention illustrated in the accompanying drawings, wherein.

DESCRIPTION OF THE INVENTION

Figure 1:
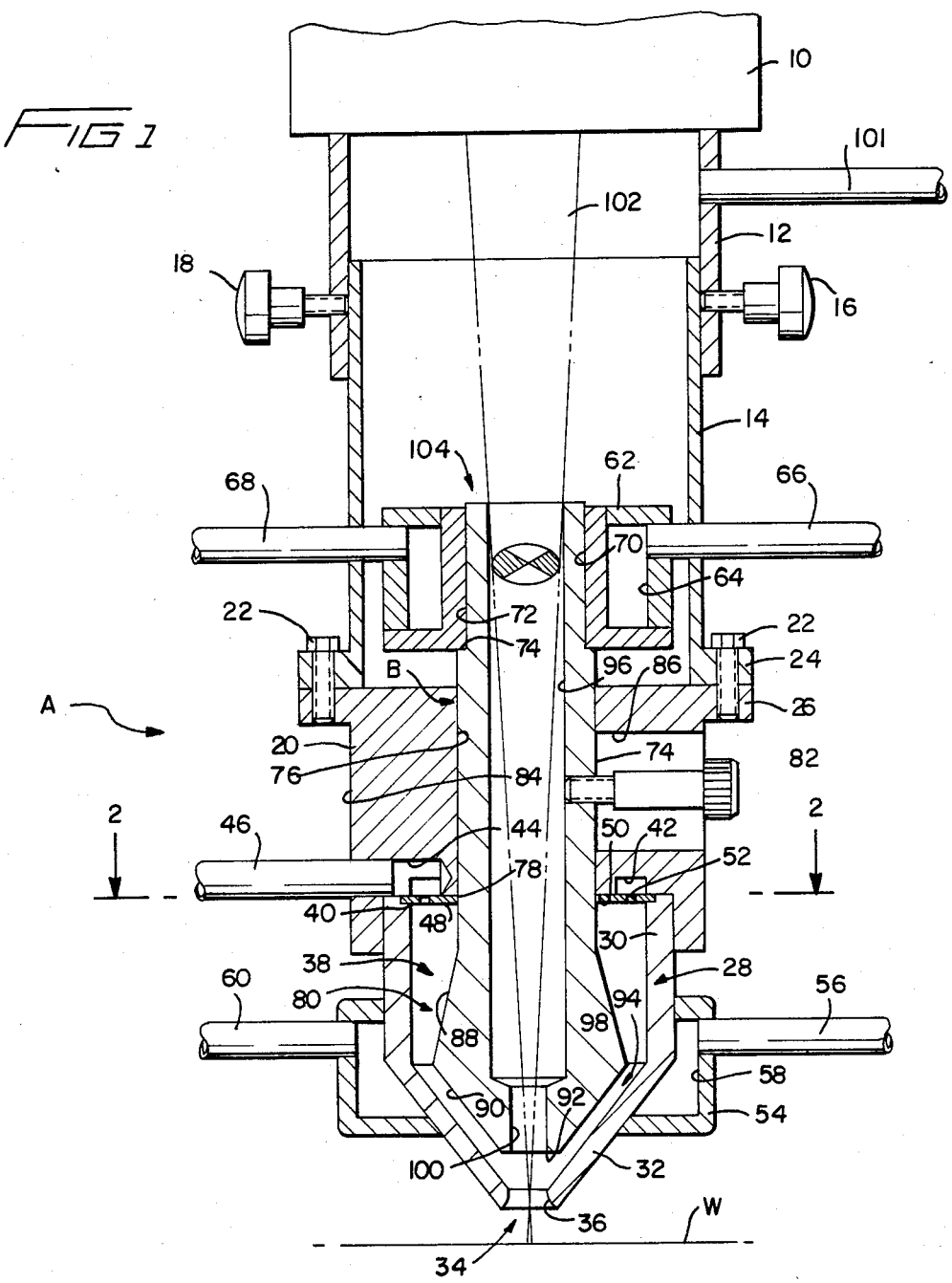
FIG. 1 is a fragmentary cross-sectional view of the laser spray nozzle assembly of the invention.

Laser spray nozzle assembly A, as best shown in FIG. 1, is conveniently positioned adjacent a surface of metallic workpiece W. The nozzle assembly A operates on the workpiece W to apply a cladding layer for enhancement of the surface properties thereof. One particular cladding technique involves the application of carbide particles in order to provide improved wear resistance.

Those skilled in the art will understand that other alloying powders may also be utilized to effect changes in other surface properties.

Laser source 10, as best shown in FIG. 1, is coupled to fixed cylindrical telescope portion 12. Adjustable telescope portion 14 is coaxially slidably mounted within portion 12, and is likewise cylindrical. Set screws 16 and 18 extend from portion 12 and are engageable with portion 14 for locking the portion 14 at a preselected axial position. Preferably, the laser source 10 cooperates with the telescope portions 12 and 14 to set the diameter of the beam as it exits the nozzle, as well as for focusing the beam on the workpiece W. The telescope and focusing assemblies are well known in the art and need not further be elaborated on here.

Figures 3, 4:
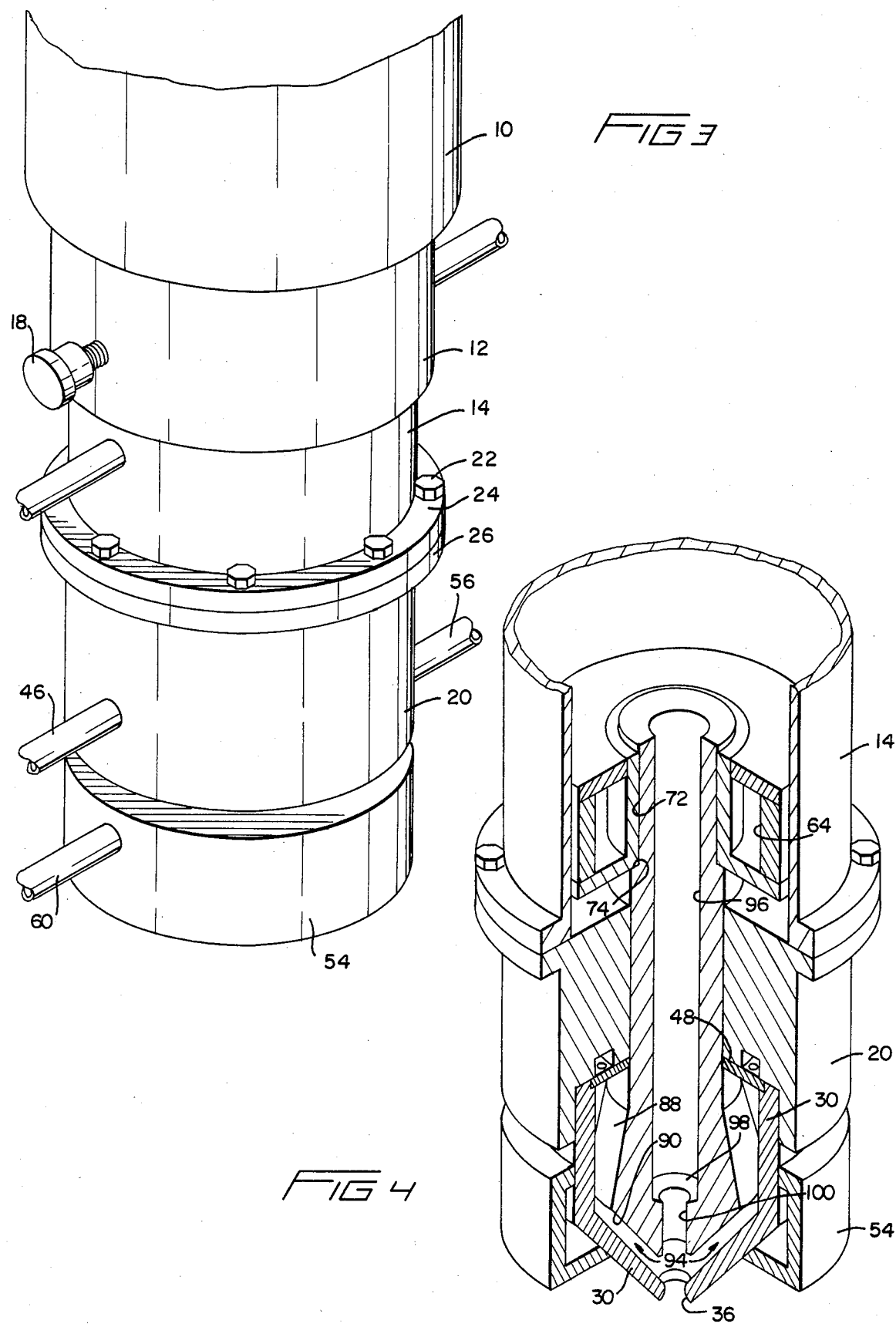
FIG. 3 is a perspective view of FIG. 1.
FIG. 4 is a fragmentary perspective view with portions broken away.

Body 20 is secured to the lower end of telescope portion 14 by bolts 22. Preferably, telescope portion 14 has a lower peripheral flange 24 which mates with a cooperating flange 26 at the upper portion of body 20. In this way, the bolts 22 are radially outwardly spaced. Housing 28 is secured to body 20 at the lower end thereof and include an axially extending wall portion 30 from which inwardly converging tapered portion 32 extends. Converging tapered portion 32 terminates at opening 34 which has outwardly flaring wall portion 36. As best shown in FIGS. 1 and 4, the housing 28 is hollow or recessed and provides a chamber 38, as will be further explained.

Groove 40 extends annularly about the upper end of housing 28. Similarly, an annular groove 42 is cut in body 20 adjacent the groove 40. Duct 44 extends radially outwardly from and in communication with groove 42. The duct 44 is in communication with powder supply pipe 46, for reasons to be further explained.

Figure 2:
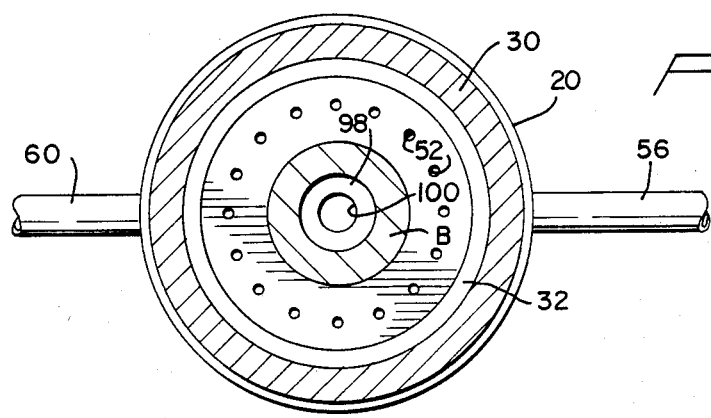
FIG. 2 is a cross-sectional view taken along the section 2—2 of FIG. 1 and viewed in the direction of the arrows.

Powder distribution plate 48 is seated within groove 40, as best shown in FIGS. 1 and 4, and is maintained in position by face 50 of body 20. In this way, the plate 40 is maintained centered within the chamber 38. Powder distribution openings 52, as best shown in FIGS. 1, 2 and 3, are equiangularly disposed about the plate 48 and are equidistant the central axis of plate 48. Each of the openings 52 is centrally aligned relative to the overlying groove 42 and permits powder to flow from the groove 42 into the chamber 38. Preferably, each of the openings 52 has a uniform hole size of from about 0.5 mm to about 1 mm. Such a hole size is sufficient to permit powder having a size range of about 40 to about 200 microns to flow, this powder size being most appropriate for laser cladding.

Jacket 54 surrounds housing 28 and is disposed adjacent outlet 34. Coolant inlet pipe 56 communicates with chamber 58 of jacket 54. Coolant outlet pipe 60 likewise communicates with chamber 58 in order to remove the coolant fluid. Preferably, the coolant fluid is water or similar fluid, such as would be known to those skilled in the art. The jacket 54 therefore helps to keep the housing 28 relatively cool; an important consideration since the alloying temperature can exceed 3000° C., a temperature sufficient to cause the housing 28 to distort and therefore alter powder flow if not cooled.

Jacket 62 is mounted within telescope portion 14 and is axially movable therealong. Jacket 62 has a coolant chamber 64 which is in flow communication with resilient coolant supply pipe 66. Similarly, resilient coolant outlet pipe 68 is in flow communication with chamber 64 in order to remove the coolant after having been warmed. Preferably, the circulating coolant fluid is water, or other similar material known to those skilled in the art. While the pipes 66 and 68 are shown as being resilient, it is merely necessary that they permit axial movement of jacket 62.

Jacket 62 has a central aperture 70 in which nozzle body B seats. The body B has a groove 72 around the upper end thereof which corresponds with the diameter of the aperture 70. The groove 72 defines a seat or shoulder 74 which properly positions the body B within the aperture 70. Body 20 has an aperture 76 coaxial with aperture 70 and through which the body B extends. Similarly, plate 48 has an aperture 78 which is coaxial with the aperture 70 and of the same diameter as the aperture 76 so that the nozzle body B may likewise extend therethrough. The nozzle body B has a throat portion 79 of continuous diameter extending from shoulder 74 to head 80 in order to permit the body B to move axially through the aperture 76 and 78. Set screw 82 is engageable with the side wall 84 of the body 20 in the area of recess 86. The set screw 82 is engageable with the throat 79 of the body B in order to lock the body B at a selected elevation along the axis.

Head 80 has an outwardly flaring portion 88 positioned within chamber 38 and an inwardly flaring portion 90 which conforms to the orientation of the tapered portion 32 of housing 28, as best shown in FIGS. 1 and 4. The tapered portion 90 is frustoconical and has a head portion 92 disposed adjacent outlet opening 34.

The flaring portion 90 has the same angulation as does the flaring portion 32 so that the portions 90 and 32 extend parallel to each other, and therewith provide a gap of substantially uniform dimension. Axially movement of the body B therefore causes this gap 94 to increase or decrease in dimension, as required in the particular circumstance.

Body B has a central aperture 96 which extends through body B from the upper end defined by groove 72 to the lower end defined by the head 80. Preferably, the aperture 96 has uniform diameter for most of its length and inwardly tapers in the area of tapered portion 90, as at 98. Secondary coaxial aperture 100 extends from tapered portion 98 through head portion 82 and is substantially the same diameter as outlet 34. In this way, the aligned apertures 96, 98 and 100 provide a passageway permitting the laser beam to be transmitted from source 10 through outlet 34 to workpiece W.

Powder supply pipe 46 is, preferably, in flow communication with a powder feeder in order to supply alloying powder to the groove 42, from whence it communicates to chamber 38. The alloying powder is supplied through the pipe 46 as a gas dispersion, such as through the use of inert gas, at a minimum flow rate of 3 cubic feet per hour, and a maximum of 8 cubic feet per hour. Preferably, the powder feeder (not shown) is a screw-type feeder and the maximum gas flow rate is established when the powder flows without requiring the use of the screw.

Inert gas is also introduced to telescope portion 12 through line 101 and moves coaxially with the beam through the outlet 34. The gas reduces the flame from the fusion process, and prevents the gaseous plasma from entering housing 28. The inert gas used for this purpose has a minimum flow rate of 4 cubic feet per hour, with a maximum flow rate of 16 cubic feet per hour. The maximum flow rate is reached when the direction of the powder exiting the housing 28 changes. Furthermore, the selected gas may, advantageously, assist the metallurgical properties of the coating.

The nozzle body B is, preferably, made of copper and is polished so as to be extremely reflective to the operating wavelength of the beam established by the laser source 10. Preferably, the laser source 10 is a $CO_2$ laser device and has an operating wavelength of 10.6 microns. Copper is also preferred because it helps to conduct the heat of fusion to the water cooled jackets in an efficient manner.

The laser beam 102, as best shown in FIG. 1, propogates from laser source 10 through the body B and the outlet 34 so as to illuminate the workpiece W. Approximately 10% of the aperture 96 at the beam opening portion 104 is utilized as clearance in order to tolerate some minor misalignment and other inaccuracy. The maximum beam diameter at the opening 104 is therefore 90% of the opening diameter, although this may be regulated as appropriate.

The present invention permits directional feeding and/or hard facing, while maintaining accurate directionality of the powder into the melt pool. The nozzle delivers a more even coating to a wider range of geometrically shaped parts. Coating time is reduced because of the ability to coat in any direction. Similarly, powder waste is reduced because of the coaxial flow of the powder with the laser beam.

The prior art powder delivery systems suffered from inconsistencies in powder application, directional limitations and the inability to coat geometrically complex parts. There are three basic variables extant in a laser hard facing system. They are: powder flow rate consistency, laser beam delivery mechanism and powder alignment. Powder alignment is most crucial for producing a consistent coating, although all three factors determine the coating's metallurgical properties.

On its path to the substrate or workpiece, the laser beam passes through a stream of powder particles exiting the outlet 34. The beam raises the temperature of a portion of the particles but does not melt them. Thus, a certain fraction of the incident beam energy is absorbed in preheating the powder, while the balance is absorbed by the workpiece, thereby producing a thin fusion zone. A portion of the powder is heated because the beam and the powder actually converge on the same point, the convergence being such that they are essentially coaxial when the sizes are considered.

OPERATION

The nozzle assembly A is preferably used to apply a cladding to a metal part by dispersing a controlled amount of the appropriate alloying powder into the molten pool. Typically, the nozzle will be used with various types of powders, such as carbide powders and others which are known to those skilled in the art. Regardless of the powder chosen or the effect desired, it is important that the molten pool into which the powder is dispersed be relatively small in relation to the overall article volume. This assures rapid chilling, thereby substantially reducing segregation.

A workpiece is positioned adjacent the outlet 34 of the housing 28, the exact spacing being based upon the result to be achieved. The telescope portions 12 and 14 are then adjusted so that the beam exiting the outlet 34 has a selected diameter. As noted, it is preferred that the beam diameter at the inlet 104 be approximately 10% less than the diameter of the aperture 96, in order to permit some misalignment tolerances. After the appropriate beam diameter is selected, then the beam is focused at that particular area on the article. The focus of the beam can be essentially any given distance from the workpiece W, as long as a specific energy input of approximately 50 J/mm² is achieved on the targeted spot.

Adjustment of the focal point of the powder delivery is the next step in the process. Powder flow is established through input pipe 46. The powder flows into the groove 42 and is uniformly distributed thereabout by plate 48. The powder flows through the openings 52 into the chamber 38, and finally through the gap 94 and exits the outlet 34 in the form of a hollow cone. The nozzle body B is moved axially in order to adjust the dimension of the gap 94 so that the focal point of the exiting powder coincides with the focal point of the beam 102, as does the area of the focal point. As noted, it has been found advantageous to co-locate the focal points of the beam and the powder flow so that the powder is heated by a small portion of the beam, thereby permitting more rapid dispersion within the molten pool.

The nozzle assembly A is ready for use once the focal points have been co-located by the preceding steps. The powder delivery system is initiated approximately one or two seconds prior to the beam being turned on. This is to allow the powder to commence flowing and to be available for dispersion when the beam 102 is initiated by the source 10. Initiation of the beam 102 is relatively rapid. Preferably, a secondary source of inert gas, with a flow rate of approximately 4 cubic feet per hour to about 16 cubic feet per hour, is initiated through the aperture 96 by line 101 in order to prevent dirt, and the like, from moving upwardly into the beam passageway. The workpiece W may then be moved relative to the outlet 34 so that the coating can be evenly applied thereto.

While this invention has been described as having a preferred design, it is understood that it is capable of further modifications, uses and/or adaptations of the invention, following in general the principle of the invention and including such departures of the present disclosure as come within known or oustomary practice in the art to which the invention pertains, and as may be applied to the central features hereinbefore set forth, and fall within the scope of the invention of the limits of the appended claims.

What I claim is:

1. A laser spray nozzle assembly, comprising:
   (a) a nozzle body with first and second spaced apart end portions and a beam passageway extending therebetween for permitting a laser beam to enter said passageway through said first end portion and to exit through said second end portion;
   (b) a housing surrounding said second end portion and spaced therefrom and forming an annular passage therewith and including an opening coaxial with said beam passageway for permitting a laser beam to pass therethrough;
   (c) means operably associated with said passage for supplying a powder thereto so that the powder and the beam converge on a common location.

2. The assembly of claim 1, wherein:
   (a) means being associated with said passage for uniformly distributing the powder about said passage.

3. The assembly of claim 2, wherein:
   (a) said distributing means including a plate positioned in said passage upstream of said opening; and,
   (b) a plurality of openings being spaced about said plate for distributing the powder.

4. The assembly of claim 1, wherein:
(a) said second end portion being frustoconical; and,
(b) said housing having a lower portion tapering toward said opening and conforming to said second end portion for therewith providing a gap of uniform dimension.

5. The assembly of claim 4, including:
(a) means being operably associated with said body for moving said body and thereby positioning said second portion relative to said lower portion.

6. The assembly of claim 1, wherein:
(a) first means being operably associated with said housing for cooling said housing.

7. The assembly of claim 6, wherein:
(a) second means being operably associated with said first end portion for cooling said first end portion.

8. The assembly of claim 1, wherein:
(a) means being associated with said nozzle body for focusing the beam.

9. The assembly of claim 8, wherein:
(a) laser beam generating means being coupled with said body.

10. The assembly of claim 3, wherein:
(a) a groove being disposed in said housing and being in flow communication with supply means; and,
(b) said plate being positioned between said groove and said passage so that the powder is distributed in said groove prior to entering said passage.

11. The assembly of claim 10, wherein:
(a) said openings having a uniform diameter of from about 0.5 to about 1.0 mm; and,
(b) said openings being equiangularly spaced apart and equidistant from said passageway.

12. A nozzle for a laser cladding system, comprising:
(a) laser beam generating means;
(b) a generally cylindrical apertured housing having a first end portion operably associated with said generating means for receiving a laser beam and a second end portion positionable adjacent a workpiece so that the laser beam exiting said second end portion is directed at the workpiece;
(c) a recess in said second end portion coaxial with said aperture forming a powder distribution chamber and said chamber having an outlet coaxial with said aperture;
(d) an apertured nozzle body coaxially positioned in said housing and including a beam receiving passageway through which the generated beam passes; and,
(e) powder distribution means positioned within said chamber for distributing powder therein so that the beam and the powder exit said housing and converge on a common location.

13. The nozzle of claim 12, wherein:
(a) said body having a frustoconical portion disposed adjacent said outlet;
(b) said second end portion tapering toward said outlet for forming a gap with said frustoconical portion; and,
(c) cooling means being operably associated with said second end portion.

14. The nozzle of claim 12, wherein:
(a) an annular groove being disposed in said second end portion upstream of said outlet;
(b) means communicating with said groove for supplying powder thereto; and,
(c) a plate being positioned within said chamber adjacent said groove and having a plurality of powder distributing openings therein for causing uniform distribution of the powder.

15. The nozzle of claim 13, wherein:
(a) means being associated with said body for moving said body along the axis thereof for regulating said gap and thereby controlling the flow of powder through said outlet.

16. The nozzle of claim 15, wherein:
(a) said first end portion including adjustable telescope means for adjusting the size of the beam exiting said outlet; and,
(b) means being associated with said body for focusing the beam.

17. The nozzle of claim 14, wherein:
(a) each of said openings having a diameter of from about 0.5 mm to about 1.0 mm; and,
(b) said openings being equidistant from said passageway.

18. A powder cladding system, comprising:
(a) a housing having a central aperture extending between a first end and an opposite second end;
(b) a nozzle housing secured to said second end and having a coaxial recess forming a powder distribution chamber and said nozzle housing including a tapered portion terminating in an outlet;
(c) a nozzle body positioned within said housing and having a coaxial beam passageway, said body having a frustoconical portion adjacent to and spaced from said tapered portion for therewith forming an annular gap;
(d) means associated with said chamber for supplying cladding powder thereto;
(e) adjustable telescope means secured to said first end for regulating the size of a laser beam exiting said outlet;
(f) laser beam generating means operably associated with said telescope means for directing a laser beam through said nozzle body so that the beam and the powder converge on a common location; and,
(g) means associated with said telescope means for focusing the beam exiting said outlet.

19. The system of claim 18, wherein:
(a) an annular groove being disposed in said housing adjacent said chamber and being in flow communication with said supply means for initially receiving the powder;
(b) a distribution plate being disposed between said groove and said chamber, said plate including a plurality of openings equidistant said passageway for distribution of the powder prior to the powder entering said chamber; and,
(c) cooling means being operably associated with said nozzle housing.

20. The system of claim 19, wherein:
(a) means being operably associated with said nozzle body for moving said body along the axis thereof for adjusting the spacing of said frustoconical portion relative to said tapered portion and thereby regulating the flow of powder through said outlet.

21. A laser cladding method, comprising the steps of:
(a) providing a laser nozzle assembly having a central beam passageway and an annular coaxial powder dispersing chamber;
(b) positioning a workpiece adjacent the nozzle assembly outlet;
(c) simultaneously directing the beam and the powder at a common location on the workpiece so that the beam melts a thin layer of the workpiece and the powder becomes dispersed within the molten layer; and,
(d) advancing the nozzle assembly relative to the workpiece.

* * * * *